United States Patent [19]
Wang et al.

[11] Patent Number: 5,958,519
[45] Date of Patent: Sep. 28, 1999

[54] METHOD FOR FORMING OXIDE FILM ON III-V SUBSTRATE

[75] Inventors: Hwei-Heng Wang, Taoyuan; Yeong-Her Wang; Mau-Phon Houng, both of Tainan, all of Taiwan

[73] Assignee: National Science Council, Taipei, Taiwan

[21] Appl. No.: 08/929,639

[22] Filed: Sep. 15, 1997

[51] Int. Cl.[6] ..................................... B05D 1/18
[52] U.S. Cl. .................... 427/443.2; 427/126.3; 427/309; 438/767
[58] Field of Search .............. 427/443.2, 126.3, 427/309; 438/767

[56] References Cited

U.S. PATENT DOCUMENTS

| | | |
|---|---|---|
| 3,859,178 | 1/1975 | Logan et al. . |
| 3,890,169 | 6/1975 | Schwartz et al. . |
| 3,898,141 | 8/1975 | Ermanis et al. . |
| 3,914,465 | 10/1975 | Dyment et al. . |
| 3,929,589 | 12/1975 | Ermanis et al. . |
| 3,935,328 | 1/1976 | Sugano et al. . |
| 4,194,927 | 3/1980 | Takagi et al. ............... 148/1.5 |
| 4,433,006 | 2/1984 | Cetionio ..................... 427/39 |
| 4,859,253 | 8/1989 | Buchanan et al. .............. 148/33.3 |

OTHER PUBLICATIONS

Basu et al., "High–pressure thermal oxidation of –GaAs in an atmosphere of oxygen and water vapor", J. Appl. Phys, 63(11), pp. 5500–5506, 1988.

P. A. Betrand, "Photochemical Oxidation of GaAs" J. Electrochem. Soc. 132(4), pp. 973–976, 1985.

Ettedgui et al., "Photon–assisted oxidation of the GaAs(100) surface using water 90 K", J. Appl. Phys. 77(10), pp. 5411–5417, 1995.

Nakamura et al., "Magnetically Excited Plasma Oxidation of GaAs", Jpn J. Appl. Phys., 35(1A), pL8–L11, 1996.

Nagayama et al., "A Process for Silica Coating", J. Electrochem. Soc., 135(8), pp. 2013–2016, 1988.

Primary Examiner—Roy V. King
Attorney, Agent, or Firm—Michael J. Brown; Irving M. Fishman; John L. Chiatalas

[57] ABSTRACT

A method is provided for forming an oxide film on a III-V substrate. The method includes steps of (a) preparing an acidic solution containing a IIIA-ion, (b) adding an basic solution into the acidic solution to provide a growth solution of a specific pH value, and (c) placing the III-V substrate into the growth solution to form the oxide film on the III-V substrate.

18 Claims, 6 Drawing Sheets

METHOD FOR FORMING OXIDE FILM ON III-V SUBSTRATE

FIELD OF THE INVENTION

The present invention is related to a method for forming an oxide film on a III-V substrate, and more particularly to a method for forming an oxide film in liquid phase near room temperature.

BACKGROUND OF THE INVENTION

Oxidation process is a basic process for producing integrated circuits (IC) and manufacturing relevant products. In silicon technology, silicon dioxide is the first choice for local oxidation, trench isolation, and surface passivation because of its easy production, ready control, and excellent property. Moreover, the size of device elements gets smaller and smaller and it becomes more difficult to isolate a small element from others. The development of oxidation is very important to enter the filed of submicron. There are two major methods for forming silicon oxides based on different applications; one is dry thermal oxidation, and the other is wet thermal oxidation. The oxidizing rate by dry thermal oxidation is so slow that the method is only utilized for growing thin oxide layer. Thus, the growth of thick oxide layer used in trench isolation prefers wet thermal oxidation. These above methods based on silicon semiconductor have been adopted for a long time. Now, oxidation of gallium arsenide (GaAs) is concerned. GaAs offers several advantages such as higher speed, packing density, and wider bandgap, especially for processing the metal semiconductor field-effect transistor (MESFET). However, oxidation of GaAs is not processed easily and the available property is not good enough. For instance, the oxidizing rate of GaAs is very slow, e.g. less than 60 Å/hr, when the operating temperature is below 450° C. If the operating temperature is higher, unstoichiometric oxide layer is formed because the difference of saturated vapor pressure between gallium oxide and arsenic oxide is great. The loss of arsenic oxide is more serious if the oxidation is carried out at temperature above 400° C. Accordingly, the obtained oxide layer of GaAs has indefinite compositions. This trouble generally exists in oxidation of III-V compounds. The disadvantage of unhomogeneous composition is unfavorable to the application of III-V compound semiconductor having oxide layer structure such as metal-oxide semiconductor field-effect transistor (MOSFET). This is the reason that commercial integrated circuit based on III-V semiconductor is not used broadly.

By reviewing the prior references about the method for forming the oxide of III-V compounds, it is found that extensive research efforts have been done in the development of the oxidation of III-V compounds. In the previous studies, $H_2O_2$ had been employed to oxidize AlGaAs and GaAs for surface passivation of junction lasers (U.S. Pat. Nos. 3,914,465 and 3,890,196). The other approaches require electrodes (U.S. Pat. Nos. 3,898,141, 3,859,178, and 3,929,589), condensed gas (Nandita Basu, et al., High-pressure thermal oxidation of n-GaAs in an atmosphere of oxygen and water vapor, *J. Appl. Phys.* 63(11), p5500–5506, 1988), energy sources like optical illumination (P. A. Bertrand, The photochemical oxidation of GaAs, *J. Electrochem. Soc.* 132(4), p973–976, 1985), laser beam (E. Ettedgui, et al., Photon-assisted oxidation of the GaAs (100) surface using water at 90 K, *J. Appl. Phys.* 77(10), p5411–5417, 1995), or excited plasma (U.S. Pat. No. 3,935,328 and Ryuichi Nakamura, et al., Magnetically excited plasma oxidation of GaAs, *Jpn J. Appl. Phys.*, 35(1A), pL8–L11, 1996). The cost of essential equipments is great and the operating condition is trivial. An improved method is still needed to grow the oxide film of III-V compounds easily.

A method for forming a silicon oxide thin film in liquid phase and at lower temperature is developed (Hirotsugu Nagayama, et al., A new process for silica coating, *J. Electrochem. Soc.*, 135(8), p2013–2016, 1988). The potentiality of this technology is noted recently because that the oxides produced by this method are homogenous. Besides, the condition of relatively low operating temperature is really attractive. Hence, in this specification, a new chemical-assisted oxidation method applied to GaAs in liquid phase near room temperature is disclosed. The oxide film provided by this method is homogenous, smooth, electric insulated, and chemical stoichiometric.

SUMMARY OF THE INVENTION

An objective of the present invention is to provide a method for forming an oxide on a III-V substrate near room temperature.

In accordance with the present invention, a method for forming an oxide film on a III-V substrate includes steps of (a) preparing an acidic solution containing a IIIA-ion, (b) adding a basic solution into the acidic solution to provide a growth solution of a specific pH value, and (c) placing the III-V substrate into the growth solution to form the oxide film on the III-V substrate.

In accordance with another aspect of the present invention, the III-V substrate is a GaAs wafer.

In accordance with another aspect of the present invention, the oxide film is a gallium oxide-arsenic oxide film.

In accordance with another aspect of the present invention, the IIIA-ion is an aluminum ion, a gallium ion, an indium ion, or a thallium ion.

In accordance with another aspect of the present invention, the acidic solution is preferably a nitric acid.

In accordance with another aspect of the present invention, the acidic solution containing the IIIA-ion is preferably provided by adding the nitric acid of 70% concentration into a 2.25M nitrate solution of the IIIA-ion.

In accordance with another aspect of the present invention, the basic solution is provided by diluting a 28% ammonia water.

In accordance with another aspect of the present invention, the pH value is preferably from 4.0 to 4.5.

In accordance with another aspect of the present invention, the method includes, after the step b), a step of b1) stirring the growth solution to make the growth solution homogenous.

In accordance with another aspect of the present invention, the method preferably includes, after the step b1), a step of b2) removing a sediment from the growth solution by a filter paper with pores wherein the diameter of each pore is 1 μm for filtering out the sediment in the growth solution.

In accordance with another aspect of the present invention, the method includes, before the step c), a step of c1) cleaning the III-V substrate by an acetone-methanol-deionized water cleaning procedure.

In accordance with another aspect of the present invention, the method includes, after the step c1), a step of c2) forming a photoresist on a specific region on the III-V substrate for avoiding the formation of he oxide film on the specific region on the III-V substrate.

In accordance with another aspect of the present invention, the method includes, after the step c), a step of d) removing the photoresist on the III-V substrate by an organic solvent.

In accordance with another aspect of the present invention, the photoresist is a photoresist film or a noble metal film, e.g. a gold film and a platinum film.

In accordance with another aspect of the present invention, the temperature for the method is preferably from room temperature to 90° C.

In accordance with the present invention, a method for forming an oxide film on a III-V substrate includes steps of (a) preparing a specific amount of a basic solution, (b) adding an acidic solution containing a IIIA-ion into the basic solution to provide a growth solution of a specific pH value, and (c) placing the III-V substrate into the growth solution to form the oxide film on the III-V substrate.

The present invention may best be understood through the following description with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purpose of illustration and description only; it is not intended to be exhaustive or to be limited to the precise form disclosed.

Figure 1:
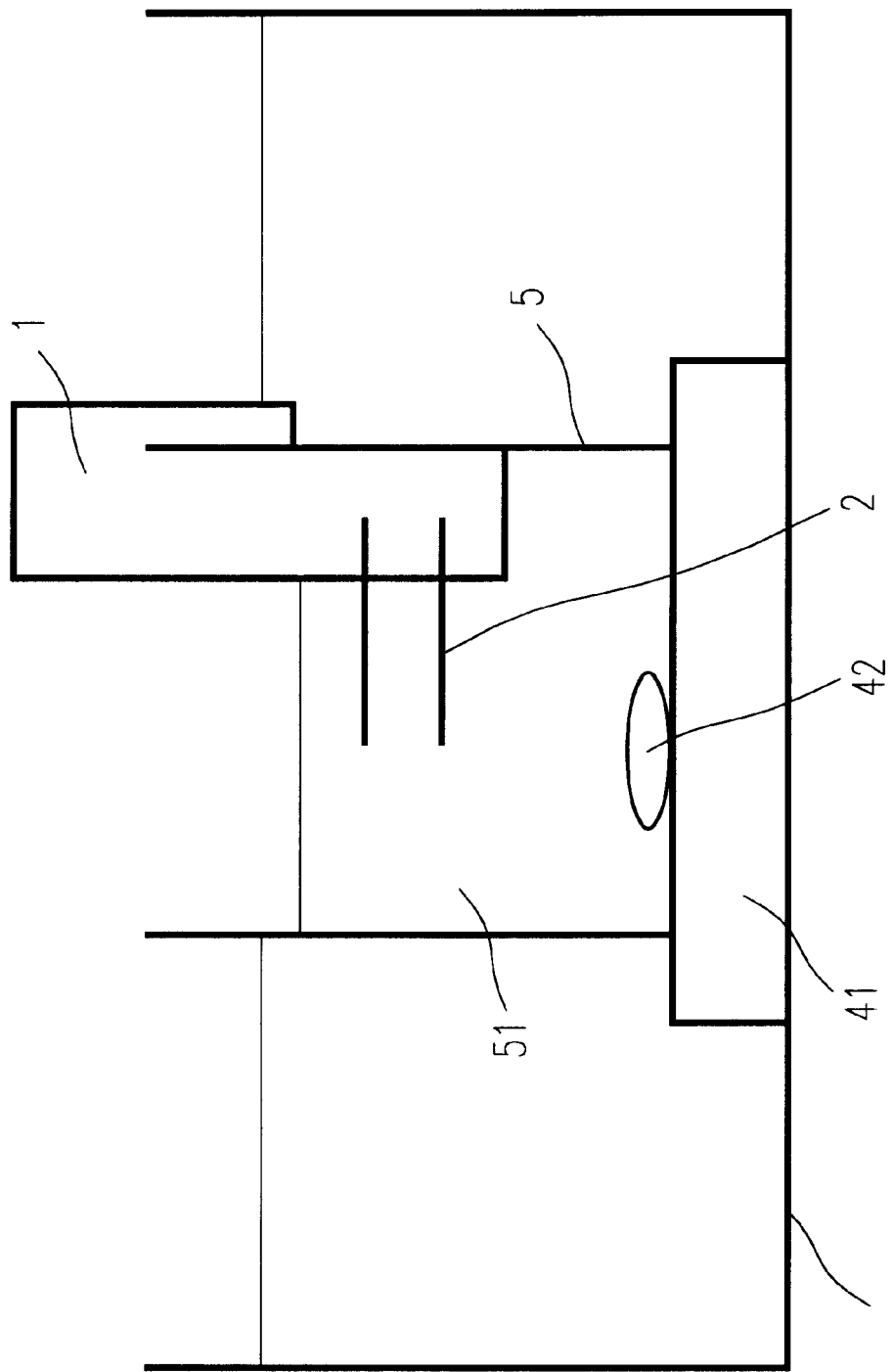
FIG. 1 is a schematic diagram showing an oxidizing system used for growing the oxide film on a III-V wafer according to the present invention.

The present invention provides a chemical-assisted oxidation method, which is an electrodeless procedure and can be executed at near room temperature, for forming an oxide film on a III-V wafer. The oxide film grows more rapidly by this method than by other prior technology, and the data will be presented later. The oxidizing system is simpler to all seeming and it is controlled more easily. Please refer to FIG. 1 which is the schematic diagram showing the oxidizing system. A stirring device including a magnetic stirrer 41 and a stir bar 42 is mounted in a thermostat 3 which is full of water. The stirring device is used for homogenizing the growth solution 51 filled in the tank 5. The thermostat 3 controls the temperature of this system by a heater and a controller to keep the temperature of the oxidizing system constant during the oxidizing process. The wafers 2 are fixed on a clamp 1 made of rubber material which will not react with the growth solution 51. The clamp 1 accompanied by the wafers 2 is put into the growth solution 51 for a few hours, and a oxide film is formed on the wafers 2.

Figure 2:
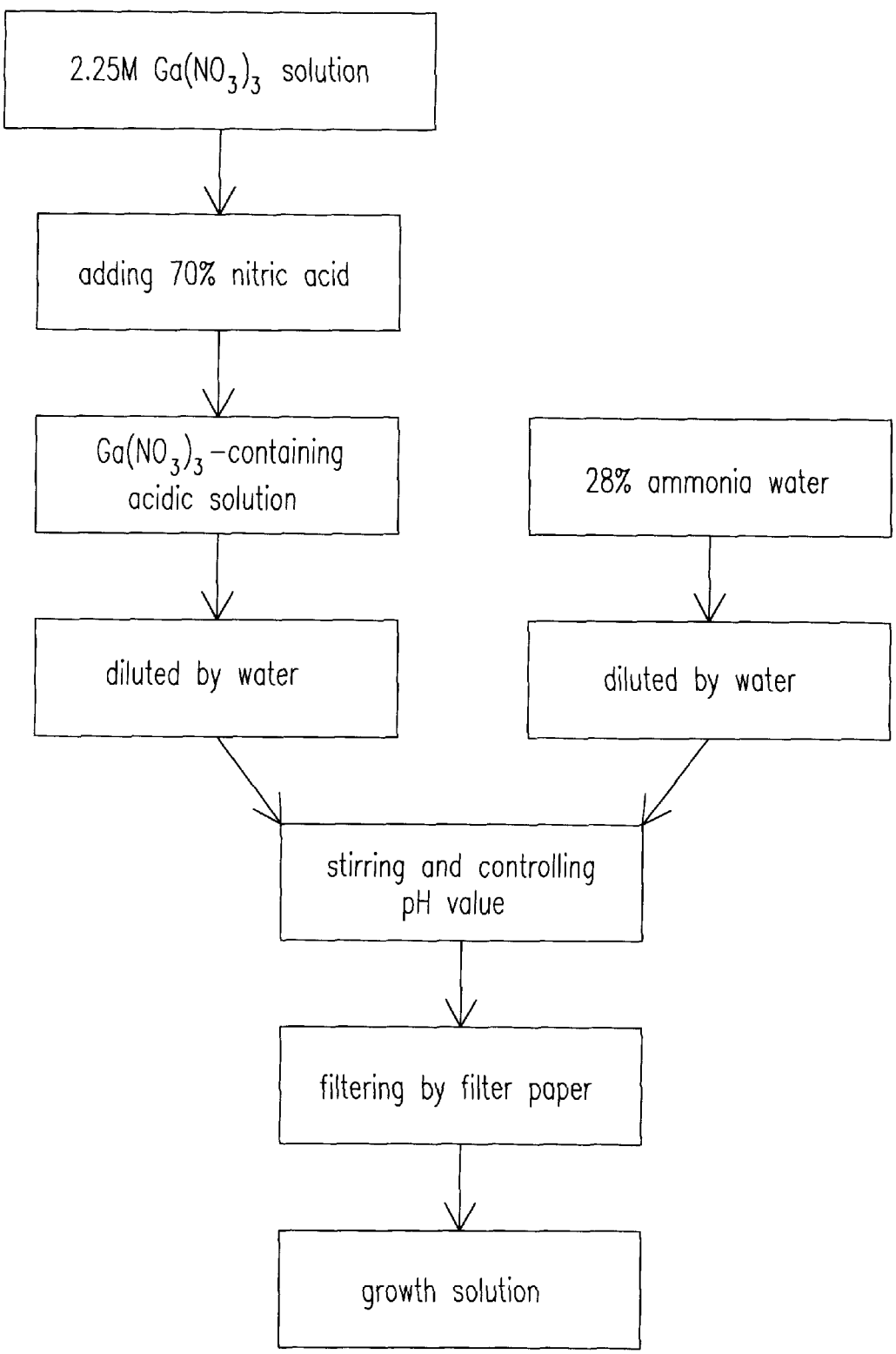
FIGS. 2 is a flowchart showing a preferred embodiment for providing a growth solution according to the present invention.

Although the oxidizing system is very simple, preparing the growth solution can not be a careless work. Please refer to FIG. 2 which shows a flowchart to prepare the growth solution for forming gallium oxide-arsenic oxide film. The preparation of the growth solution which includes three main processes is the critical procedure to grow the oxide film. The first process is to add a 70% nitric acid into a 2.25M gallium nitrate solution to provide a acidic solution containing gallium nitrate and then dilute the acidic solution by a deionized water. The second process is to add diluted ammonia water, which is provided by diluting 28% ammonia water with a deionized water, to adjust the pH value. The stirring step is executed to make this solution homogenous. The pH value heavily affects the parameters of oxidation such as oxidizing rate so it must be done carefully. According to the results of experiment, it is found that the most proper range of the pH value is from 4.0 to 4.5. The white precipitations including mainly gallium oxide and gallium hydroxide are generated during pH adjustment as following expressions:

$$Ga^{3+} + 3OH^- \rightarrow Ga(OH)_3 \downarrow \qquad (1)$$

$$2Ga^{3+} + 6OH^- \rightarrow Ga_2O_3 \downarrow + 3H_2O \qquad (2)$$

Therefore, the solution becomes cloudy. The last process is to remove the sediment including gallium oxide and gallium hydroxide by a filter paper. The diameter of the pores on the filter paper must be small enough, e.g. 1 $\mu$m, to filter out the sediment. Then, the obtained solution is so-called growth solution. This growth solution can facilitate the formation of gallium oxide and arsenic oxide on the GaAs wafer.

Figure 3:
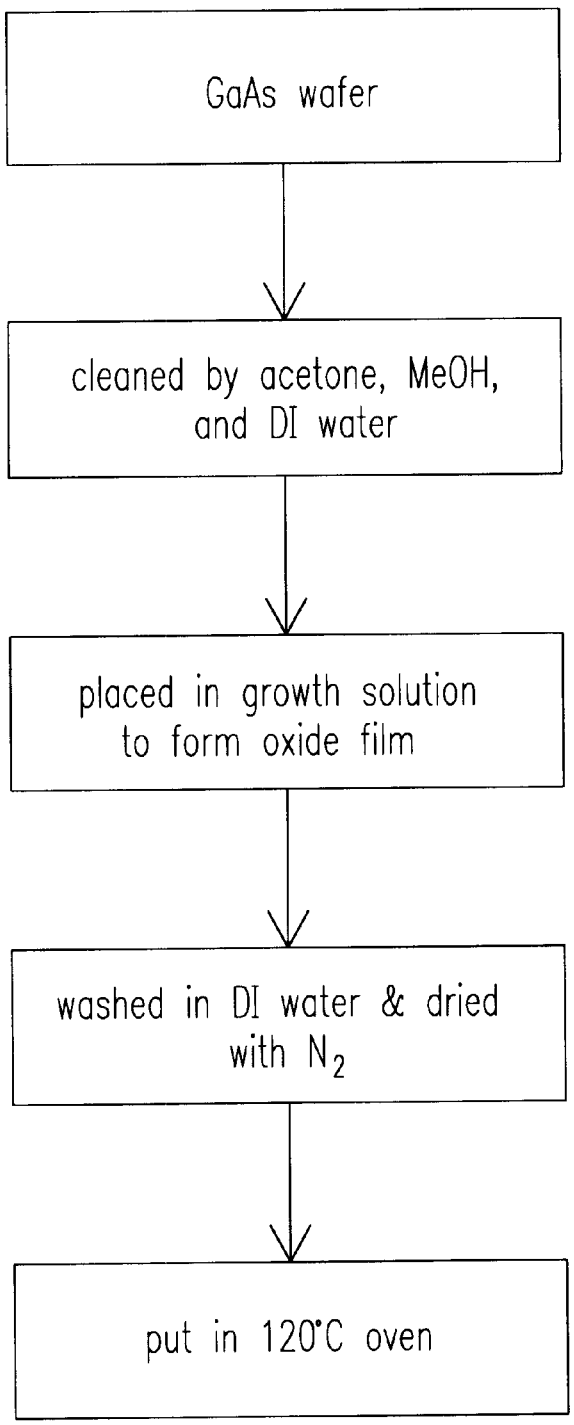
FIG. 3 is a flowchart showing a preferred embodiment for forming a gallium oxide-arsenic oxide film on a GaAs wafer according to the present invention.

Please refer to FIG. 3 which is a flowchart showing the steps of forming the oxide film on the GaAs wafer. The GaAs wafer is cleaned by a standard procedure. It is cleaned by organic solvents such as trichloroethylene, acetone, and methanol, and then rinsed by deionized water. Next, the wafer is put into the above-mentioned growth solution under constant temperature ranging from 40° C. to 70° C. for 1 to 3 hours, and the oxide film is formed at the maximum rate of 900 Å/hr. The wafer is taken up while the desired thickness of the oxide layer is achieved. After washed in deionized water and dried with nitrogen, the wafer is put into an oven with temperature set at 120° C.

Figure 4A:
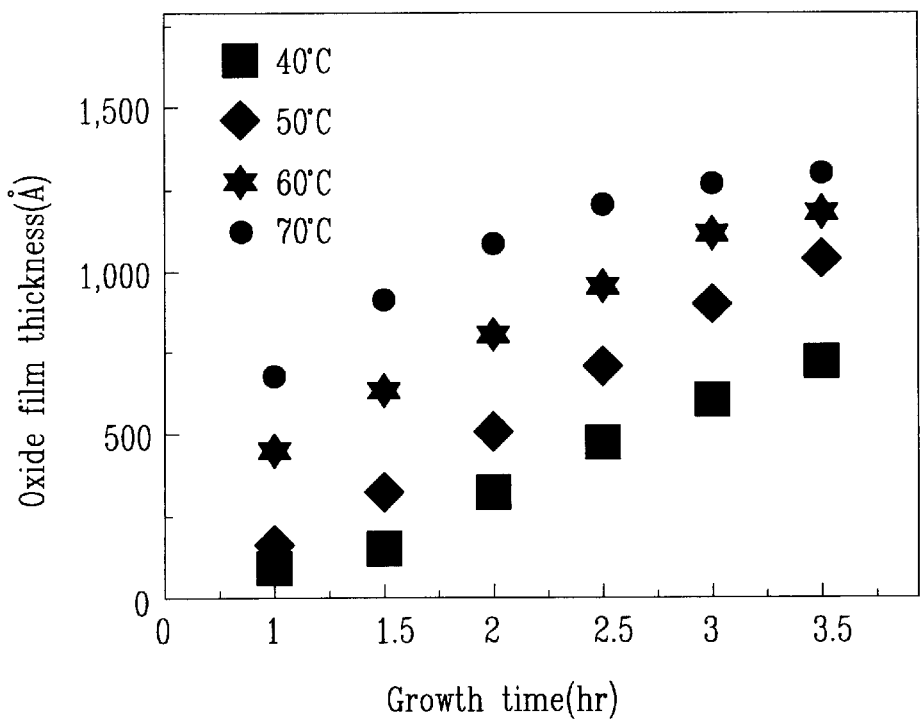
FIGS. 4(a) and (b) are diagrams showing the properties of the oxide film under various temperature according to the present invention.
Figure 4B:
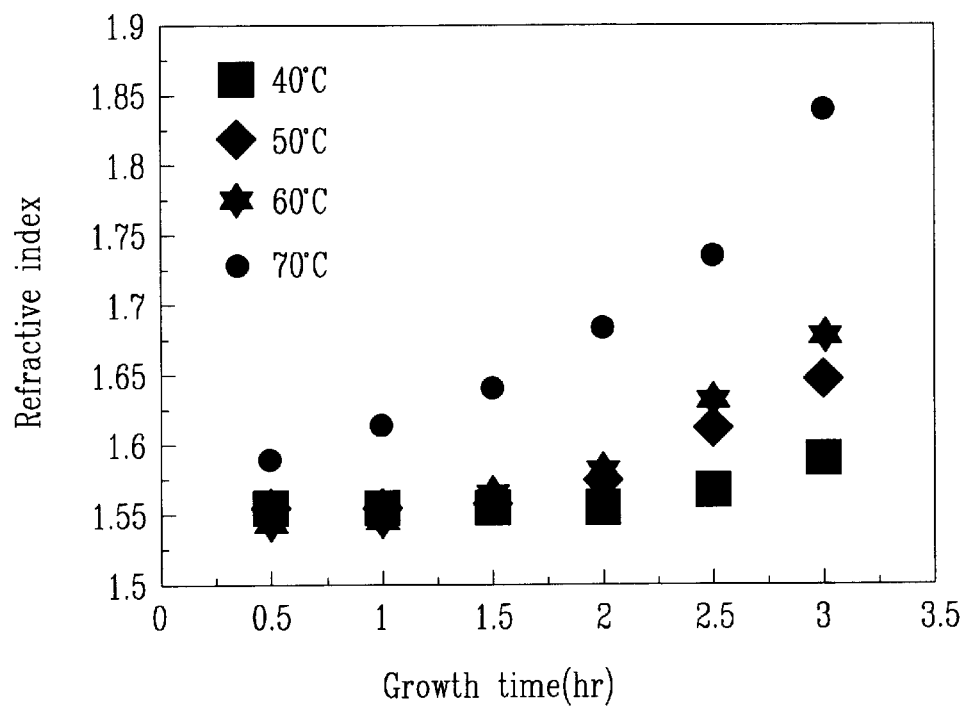

The gallium oxide-arsenic oxide film thickness and its refractive index are measured by an ellipsometer using visible laser ($\lambda$=633 nm) as the incident beam. Please refer to FIG. 4(a) showing the film thickness vs. growth time under different temperature. When the temperature of this oxidizing range is from 40° C. to 70° C., the growth rate of the oxide film is correspondingly from 250 Å/hr to 900 Å/hr. The maximum growth rate is about 15 times larger than the above-mentioned prior art. FIG. 4(b) shows the refractive index vs. growth time. It has been proved that the higher the growth temperature is, the higher refractive index (1.55~1.85) it will provide. We can decide on the operating temperature and growth time according to the desired refractive index.

Figure 5:
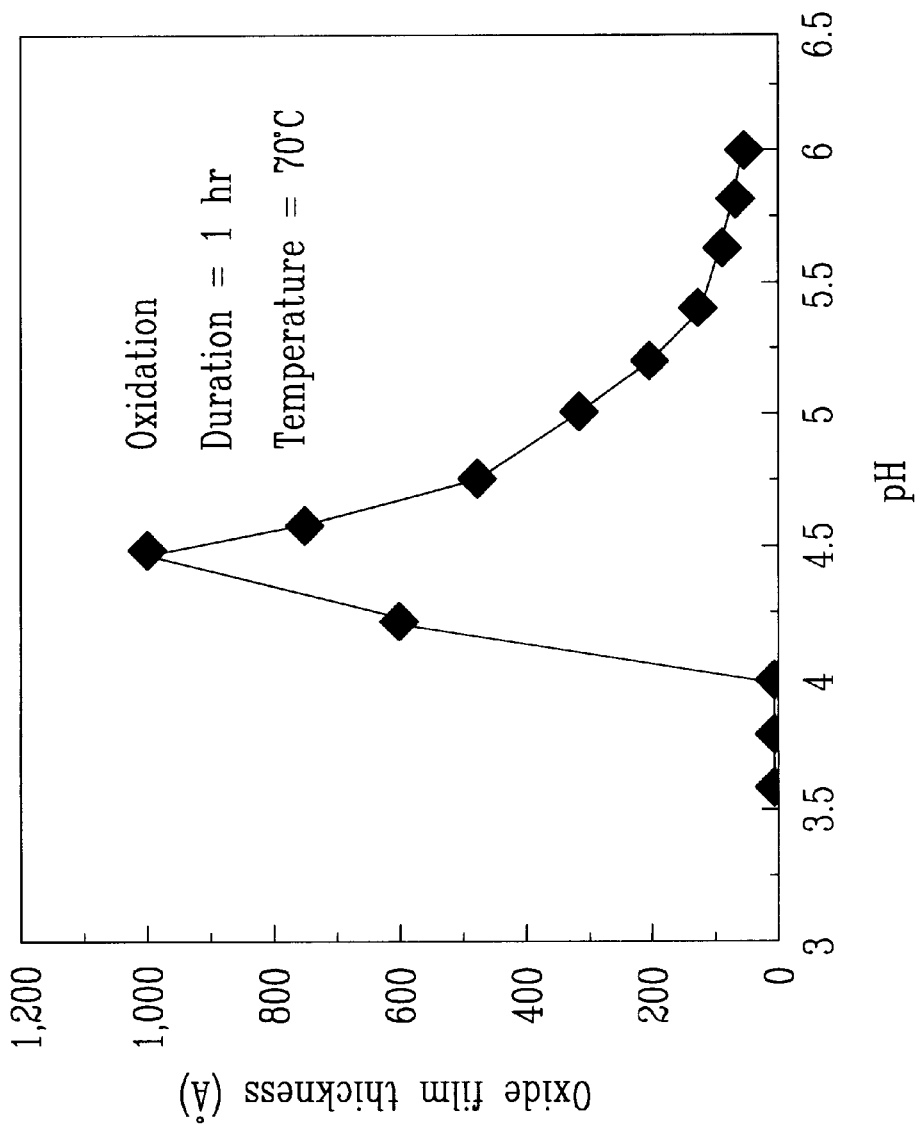
FIG. 5 is a diagram showing the oxide film at various pH value according to the present invention.

It has been indicated above that the pH plays an important role in the growth solution. FIG. 5 shows the oxide film thickness vs. pH with the growth time of 1 hour under 70°

C. Obviously, the pH value of the growth solution ranging from 4.0 to 5.5 is practicable. If the pH value of the growth solution is lower than 4.0, that is, the growth solution is too acidic, the etching becomes the dominant reaction so that the oxidation can not be observed. On the other hand, if the pH value of the growth solution is higher than 5.5, that is, the growth solution is too basic, the depletion of gallium ion in the solution results in the relatively low oxidizing rate. The reaction is expressed as following expression:

$$Ga^{3+} + 2H_2O \rightarrow GaO(OH)\downarrow + 3H^+ \quad (3)$$

If the pH value of the growth solution is higher, the reaction will proceed to right in order to generate hydrogen ion, so the concentration of gallium ion reduces and the oxidizing rate decreases. Theoretically, the solubility of the gallium oxide hydroxide (GaO(OH)) is affected seriously by the pH value of the growth solution. A high solubility of gallium oxide hydroxide is preferred to generate the gallium ion. It is found that the optima pH value is between 4.0 to 4.5. By filtering the sediment out the growth solution, a saturated solution containing gallium ion and gallium oxide hydroxide is obtained, and it indeed facilitate the growth of the gallium oxide-arsenic oxide film.

The chemical composition of the oxide film is analyzed by the X-ray photoelectron spectroscopy and Auger electron spectrum. The energy peaks of gallium in gallium oxide and arsenic in arsenic oxide are found. The ratio of the gallium and arsenic is near stoichiometric because the growth solution can prevent the arsenic oxide from escaping the oxide film. Otherwise, the cleaved cross-section of the wafer is observed in a scanning electron microscopy. The interface between the oxide film and the wafer is definite, and the surface of the oxide film is even. The oxide film is a featureless mirror-finish surface and different in color according to its thickness, e.g. purple (~700 Å) - blue (~900 Å)-yellow (~1400 Å). We define a uniformity as following equation:

$$\text{Uniformity}(\%) = [(\text{max thickness} - \text{min thickness})/(2 \times \text{mean thickness})] \times \% \quad (4)$$

The best uniformity of the oxide film thickness is within 1.1%.

According to the present invention, the oxide film can be formed on both n-type and p-type semiconductor which is a wafer or an epi-layer regardless of its orientation such as (100) or (111).

Figure 6A:
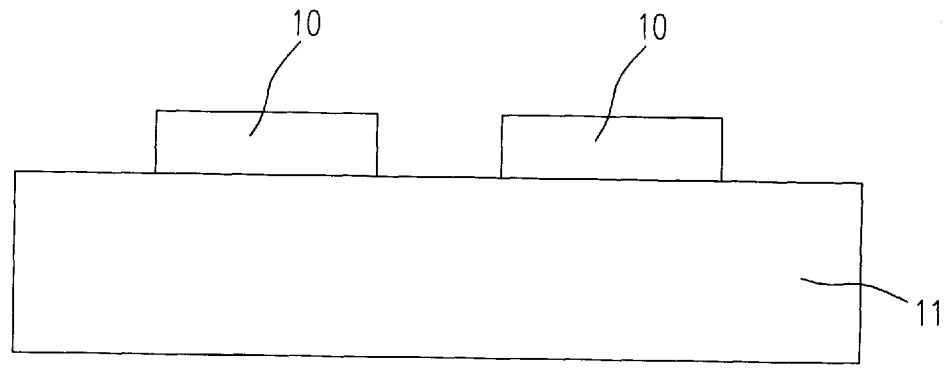
FIGS. 6(a), 6(b) and 6(c) are schematic diagrams showing the application in photolithography according to the present invention.
Figure 6B:
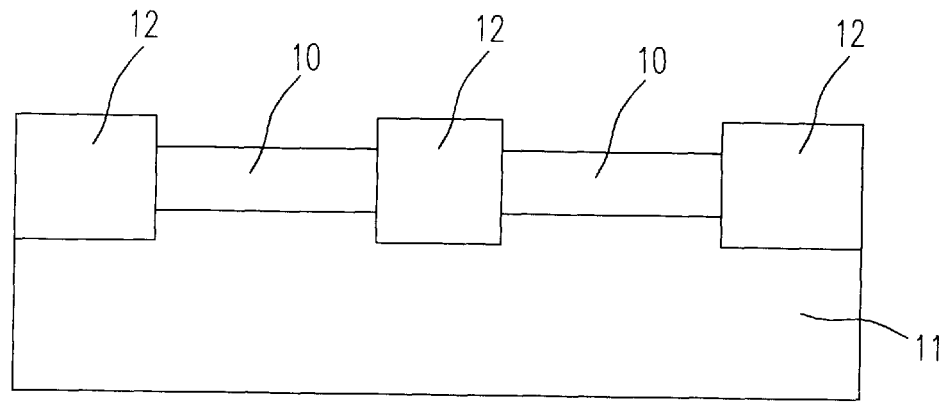
Figure 6C:
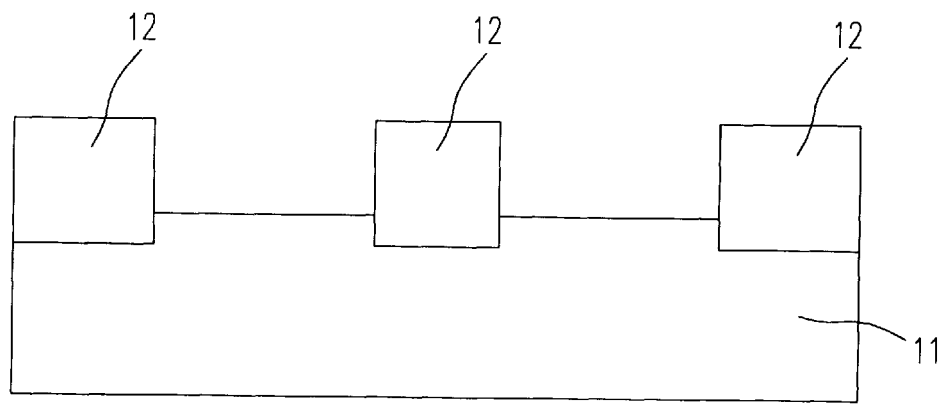

The photoresist is not an adequate mask for furnace oxidation because that it will be damaged under high temperature, but the technology according to the present invention can be applied to photolithography because of its low-temperature-grown characteristic. Please refer to FIG. 6 showing the application in photolithography. A photoresist film 10 is formed on a specific region on the GaAs substrate 11 in FIG. 6(a) to prevent the penetration of undesired materials to the specific region, no matter the penetration is in the form of diffusion, chemical reaction, or ion implantation. The photoresist film 10 can be a noble metal film such as an gold film or a platinum film. Then, the oxide film 12 is formed on the GaAs substrate 11 as shown in FIG. 6(b) according to the present invention, that is, putting the GaAs substrate 11 into the growth solution to form an oxide film. The photoresist film is a stable mask and will not be damaged by the acidic growth solution. At last, removing the photoresist film 10 in FIG. 6(c) by an organic solvent such as acetone. Hence, selective growth is completed. Besides, the practicality of the present invention is especially expected in the selfalignment field.

A metal-oxide-semiconductor (MOS) diode with metal electrode of area $5 \times 10^{-4}$ cm$^2$ and oxide film of thickness 1250 Å is made by this photolithography technology. The interface trap density calculated by the capacitance-voltage characteristic is about $10^{11} \sim 10^{12}$ cm$^{-2}$. Compared to the prior art, the electric properties of high breakdown electric field (>8 MV/cm) and high specific resistance (>$10^{13}\Omega\cdot$cm) can be maintained according to the present invention.

Heat treatment is necessary in producing elements, so the stability under high temperature is very important. In order to prove the stability after thermal treatment, a thermal annealing is executed under different temperature from 400~600° C. for 0~30 minutes. It is found that the X-ray photoelectron spectrum of a fresh oxide film is the same as the spectrum of oxide film after treated under different temperature. Therefore, the excellent chemical stability is revealed. Regarding the physical property, the denseness changes more or less because the reflective index increases about 3%. But the excellent chemical stability can meet the requirement in processing elements including oxide film structure.

In conclusion, a new method to grow an uniform and featureless oxide film on a GaAs wafer in liquid phase near room temperature is demonstrated and disclosed. Preparing and controlling the growth solution are main processes and no growth source and catalyst is needed. Even the stirring system is not necessary because the growth rate, homogeneity, and coverage are not affected very much. This method has many superior features like relatively high oxidizing rate, simple operating condition, and excellent chemical stability after thermal annealing. Having better chemical stoichiometry than that of thermal oxidation due to low-temperature-grown characteristics make this method utilizable.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming an oxide film on a IIIA-VA substrate comprising:
   (a) preparing an acidic solution containing a IIIA-ion;
   (b) adding an basic solution into said acidic solution to provide a growth solution of a specific pH value ranging from 4.0 to 5.5; and
   (c) placing said IIIA-VA substrate into said growth solution to form a IIIA oxide-VA oxide film on said IIIA-VA substrate.

2. A method according to claim 1 wherein said IIIA-VA substrate is a gallium arsenide wafer.

3. A method according to claim 2 wherein said oxide film is a gallium oxide-arsenic oxide film.

4. A method according to claim 3 wherein in said step a), said IIIA-ion is selected from the group consisting of an aluminum ion, a gallium ion, an indium ion, and a thallium ion.

5. A method according to claim 1 wherein in said step a), said acidic solution is a nitric acid.

6. A method according to claim 5 wherein in said step a), said acidic solution containing said IIIA-ion is provided by adding said nitric acid of 70% concentration into a 2.25M nitrate solution of said IIIA-ion.

7. A method according to claim 1 wherein in said step b), said basic solution is provided by diluting a 28% ammonia water.

8. A method according to claim 7 wherein in said step b), said pH value is from 4.0 to 4.5.

9. A method according to claim 1, further comprising after said step b) a step of b1) stirring said growth solution to make said growth solution homogenous.

10. A method according to claim 1, further comprising after said step b1) a step of b2) removing a sediment from said growth solution.

11. A method according to claim 10 wherein said step b2) is executed by utilizing a filter paper with pores, the diameter of each pore being 1 μm for filtering out said sediment in said growth solution.

12. A method according to claim 1, further comprising before said step c) a step of c1) cleaning said IIIA-VA substrate by an acetone-methanol-deionized water cleaning procedure.

13. A method according to claim 12, further comprising after said step c1) a step of c2) forming a photoresist on a desired region on said IIIA-VA substrate for avoiding the formation of said oxide film on said desired region on said IIIA-VA substrate.

14. A method according to claim 13, further comprising after said step c) a step of d) removing said photoresist on said IIIA-VA substrate by an organic solvent.

15. A method according to claim 13 wherein said photoresist is a noble metal film.

16. A method according to claim 15 wherein said noble metal film is one of a gold film and a platinum film.

17. A method according to claim 1 wherein the temperature for said steps (a), (b) and (c) is from room temperature to 90° C.

18. A method for forming an oxide film on a IIIA-VA substrate comprising:

(a) preparing a desired amount of a basic solution;

(b) adding an acidic solution containing a IIIA-ion into said basic solution to provide a growth solution of a specific pH value ranging from 4.0 to 5.5; and (c) placing said IIIA-VA substrate into said growth solution to form a IIIA oxide-VA oxide film on said III-V substrate.

* * * * *